(12) United States Patent
Jacob et al.

(10) Patent No.: US 8,761,215 B2
(45) Date of Patent: Jun. 24, 2014

(54) PULSE SHAPING MODULE AND GENERATOR FOR USE WITH A PULSED LASER OSCILLATOR

(75) Inventors: Michel Jacob, Québec (CA); Pascal Deladurantaye, St. Joseph de la Pointe-lévy (CA); Yves Taillon, Saint-Augustin de Desmaures (CA)

(73) Assignee: Institut National d'Optique, Quebec, Quebec (CA)

( * ) Notice: Subject to any disclaimer, the term of this patent is extended or adjusted under 35 U.S.C. 154(b) by 175 days.

(21) Appl. No.: 13/313,498

(22) Filed: Dec. 7, 2011

(65) Prior Publication Data
US 2012/0177071 A1 Jul. 12, 2012

Related U.S. Application Data

(60) Provisional application No. 61/420,794, filed on Dec. 8, 2010.

(51) Int. Cl.
*H01S 3/10* (2006.01)
(52) U.S. Cl.
USPC .............................................. 372/25; 372/30
(58) Field of Classification Search
USPC ....................................... 372/25, 30
See application file for complete search history.

(56) References Cited

U.S. PATENT DOCUMENTS

| | | | |
|---|---|---|---|
| 7,428,253 B2 | 9/2008 | Murison et al. | |
| 7,813,389 B2 | 10/2010 | Peng et al. | |
| 8,073,027 B2 | 12/2011 | Deladurantaye et al. | |
| 2003/0023912 A1* | 1/2003 | Lesea | 714/726 |
| 2005/0226279 A1* | 10/2005 | Xu et al. | 372/9 |
| 2009/0323741 A1* | 12/2009 | Deladurantaye et al. | 372/25 |
| 2011/0317793 A1* | 12/2011 | Katz et al. | 375/371 |

\* cited by examiner

*Primary Examiner* — Yuanda Zhang
(74) *Attorney, Agent, or Firm* — Merchant & Gould P.C.

(57) ABSTRACT

A digital pulse shaping module provides a digital waveform such as a pulse shape, gating or a synchronizing digital signal for use with a pulsed laser oscillator. The digital pulse shaping module includes a waveform data generator that generates N-bit words having a number N of bits. A serializer is further provided to receive the N-bit words from the waveform data generator and outputs each bit individually in a series of bits corresponding to the digital waveform. The digital pulse shaping module further includes a delay module that provides a fine delay in the outputting of the bits by the serializer. This fine delay corresponds to a number of bits smaller than N, impacting on the timing of the outputted signal at the bit level. A pulse shaping generator has a plurality of digital pulse shaping modules.

23 Claims, 13 Drawing Sheets

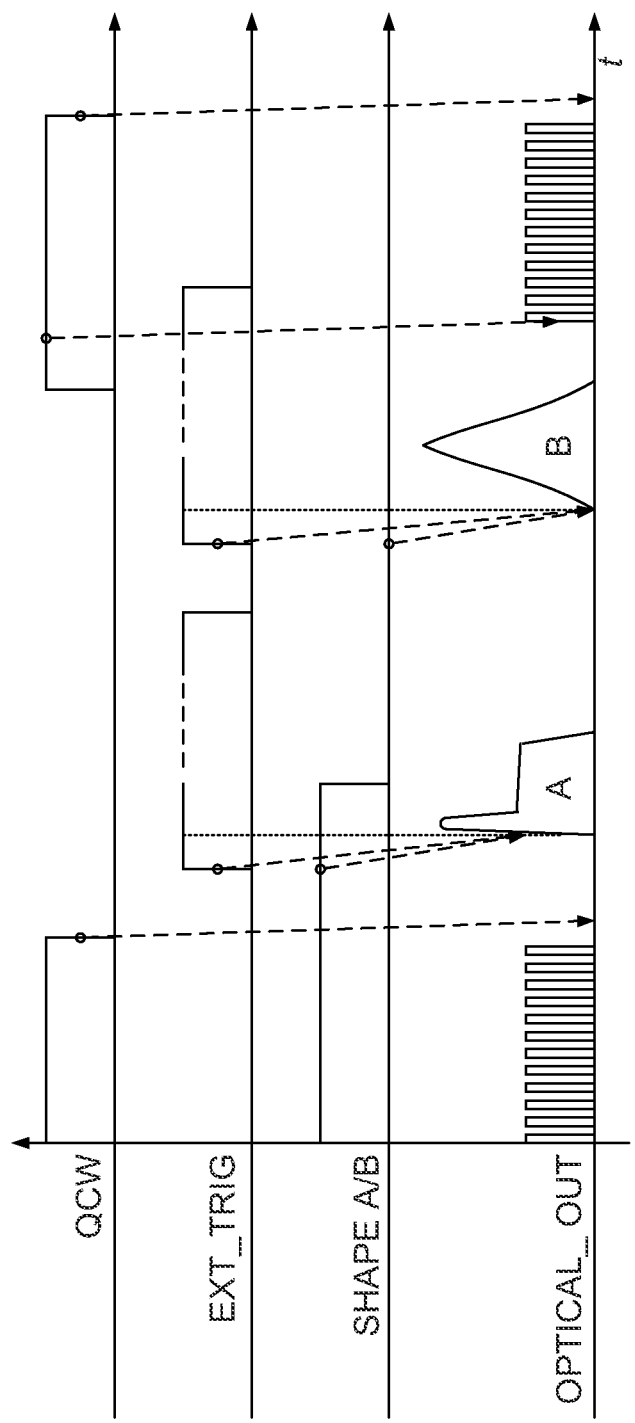

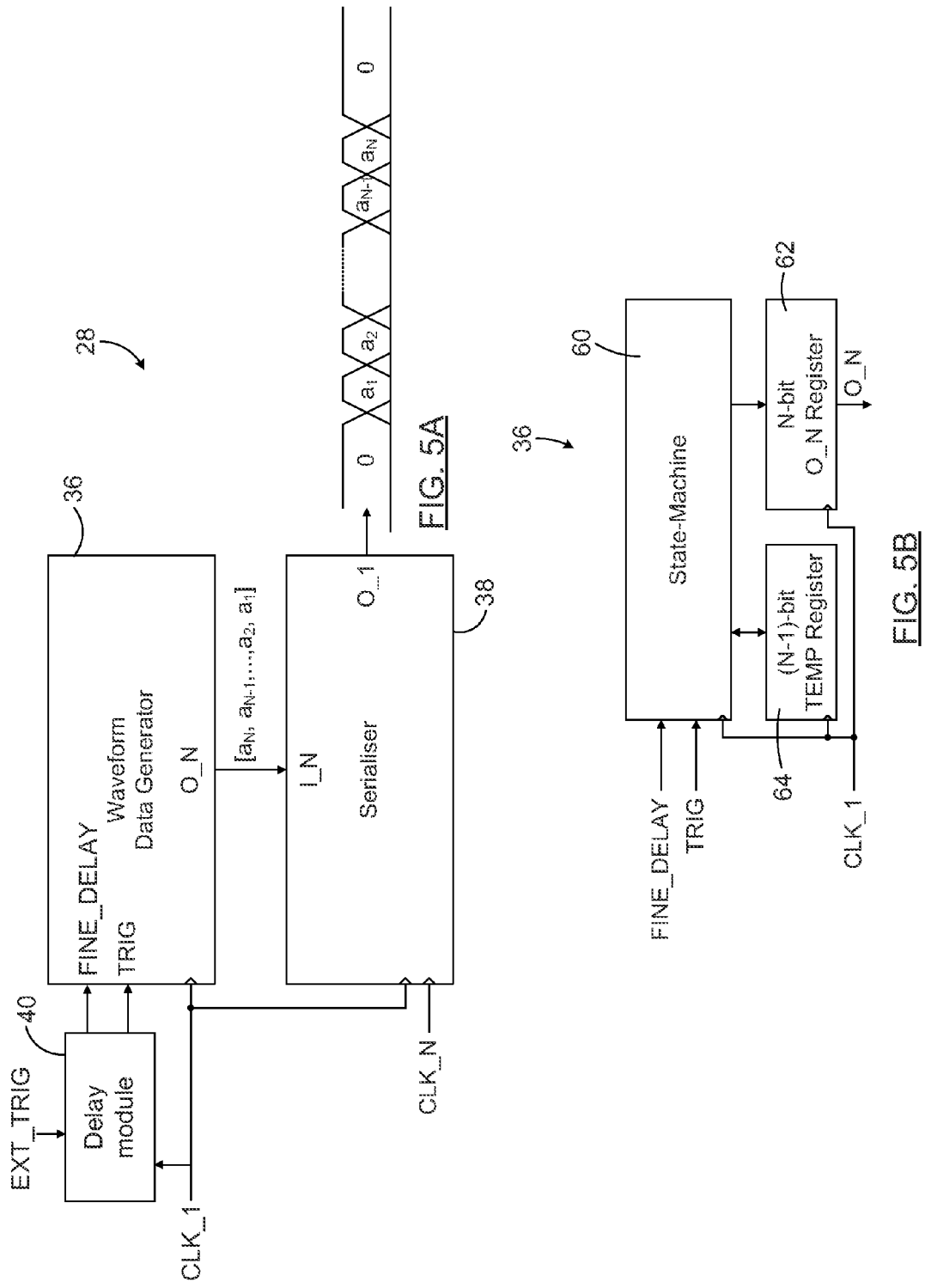

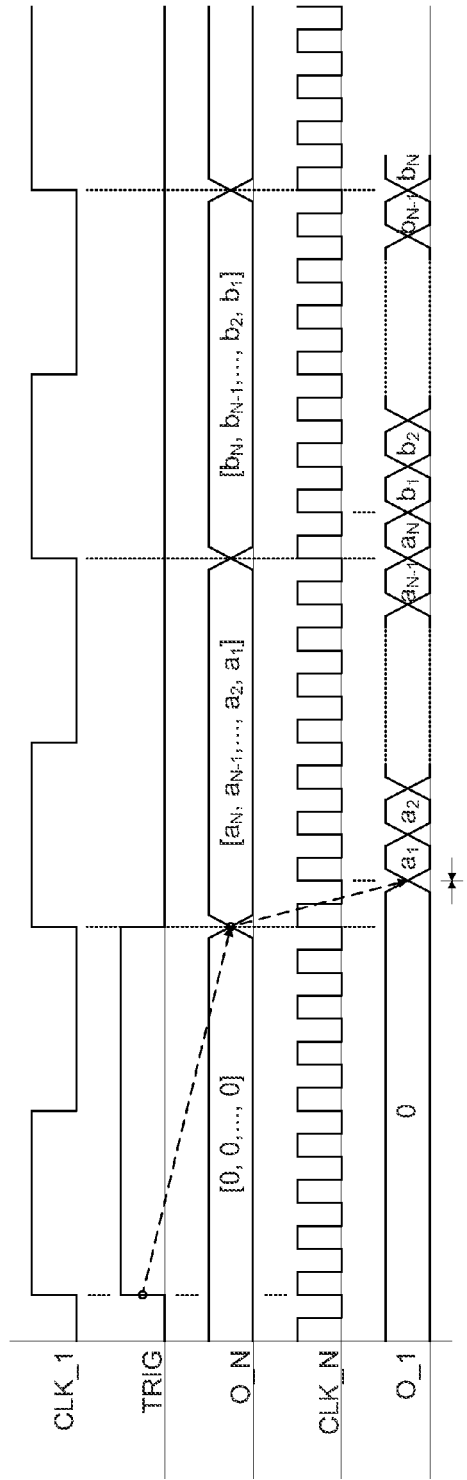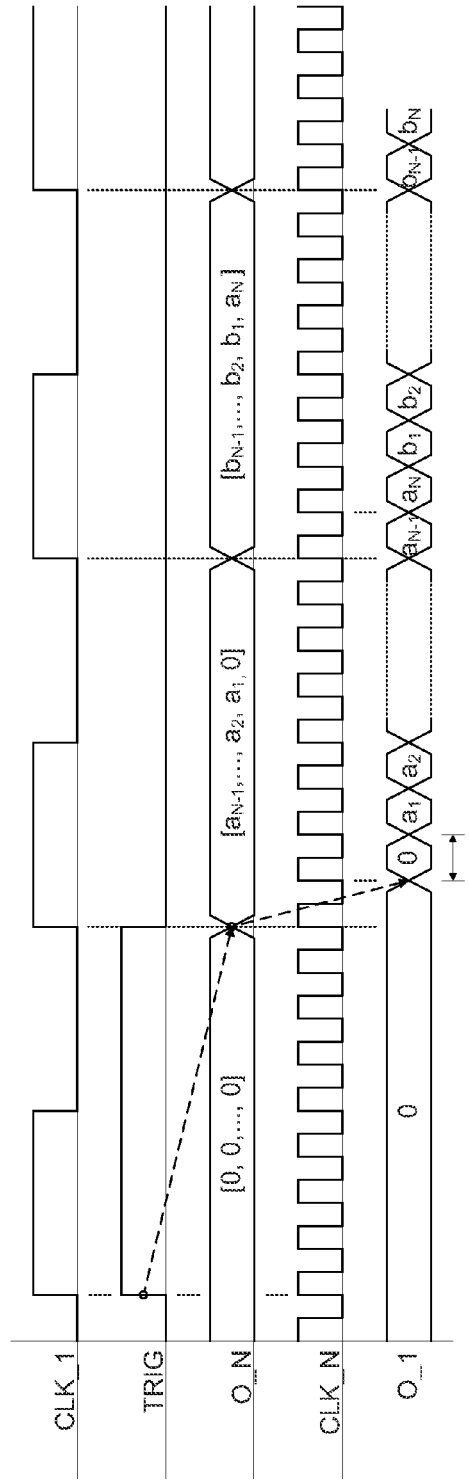

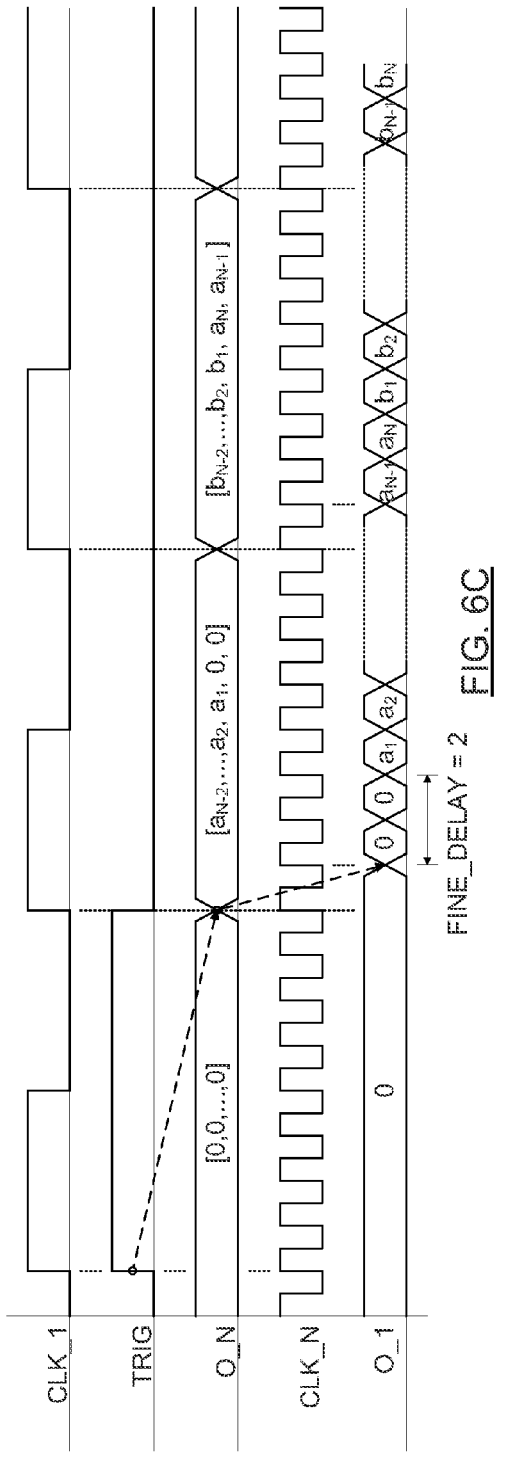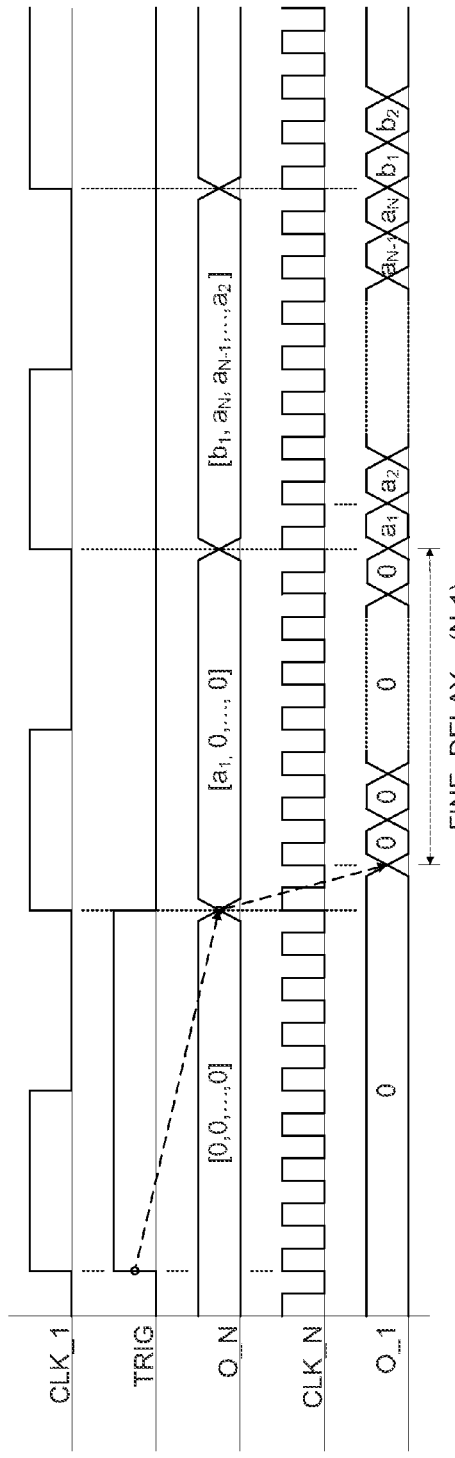
FIG. 6C
FIG. 6D

PULSE SHAPING MODULE AND GENERATOR FOR USE WITH A PULSED LASER OSCILLATOR

This application claims benefit of Ser. No. 61/420,794 filed 8 Dec. 2010 in the United States and which application is incorporated herein by reference. To the extent appropriate, a claim of priority is made to each of the above disclosed applications.

FIELD OF THE INVENTION

The present invention relates to the field of laser devices and more particularly concerns a digital platform for providing signals for use with a pulsed laser oscillator.

BACKGROUND

Several industrial laser micromachining or material processing applications, such as metal engraving or memory link repair, require that laser light pulses with specific energy and temporal characteristics be precisely directed to a specific region of interest of a target material. For many applications, the rise-time and fall-time of such light pulses must be relatively short, preferably in the order of a few hundreds of picoseconds. It is also advantageous that the intensity profile of the light pulses be arbitrarily varied over the duration of the pulse, which itself varies depending on the application. By way of example, for memory link repair, the pulse duration is typically of a few tens of nanoseconds, while for metal engraving, it is typically of a few hundreds of nanoseconds. In this context, being able to generate light pulses with some capability for dynamically varying pulse durations with a temporal resolution at the nanosecond scale is certainly desirable. The process of generating short light pulses with controllable duration and controllable temporal intensity profile is commonly known in the art as "pulse shaping".

Laser micromachining processes usually involve specifically tailored recipes consisting of a sequence of operations in which a large number of light pulses are successively impinged on a piece of material. Such recipes generally require that light pulses impinge on the target material for a given time interval during which the pulse repetition rate, the pulse shape, and sometimes the light wavelength can be dynamically switched among a predefined set of distinct combinations of these parameters. For example, the recipe may require that for a given time interval the optical output be simply turned off. The optical intensity may also be set to oscillate in what is commonly known in the art as a quasi-continuous wave (QCW) mode. A laser system operating in QCW mode typically emits a periodic signal oscillating at a frequency around 100 MHz with a duty cycle around 50%. Such functionalities are illustrated in FIG. 1, where the optical output OPTICAL_OUT, under the action of command signals QCW, EXT_TRIG, and SHAPEA/B, is switched between the above-mentioned modes.

Furthermore, in many situations encountered in automated industrial manufacturing, a laser micromachining apparatus such as the one discussed above may need to operate in concert with other manufacturing equipment. For example, it starts or halts the machining of material pieces under remote control, or it may reply when it is remotely interrogated about the current statuses of its constituent lasers.

From the discussion above, it can be seen that there is a need, at least in the context of industrial equipment, for combining some very low-level, agile and time-critical optical pulse shaping capabilities with electrical and optical power amplification, as well as high-level embedded intelligence for performing system housekeeping and managing communications with other equipment. Furthermore, such capabilities should be as low-cost as possible.

The manner in which pulse shaping is performed may originate from electronic signals, either analog or digital, or from optical ones.

U.S. Pat. No. 7,428,253 (MURISON et al.), entitled "Method and system for a pulsed laser source emitting shaped optical waveforms" presents a wavelength-tunable pulsed laser source with optical pulse shaping based on a digital approach. MURISON mentions that the shaped waveform can originate from a digital pattern stored in memory onboard of a digital-to-analog converter (DAC). However, no embedded hardware implementation of digital pulse shaping is disclosed, except for the use of an off-the-shelf laboratory instrument such as the AWG2040 (tradename) waveform generator from Tektronix Inc., (Beaverton, Oreg.).

U.S. Pat. No. 8,073,027 (DELADURANTAYE et al.), entitled "Digital laser pulse shaping module and system" discloses a standalone embedded laser micromachining instrument based on digital pulse shaping. As shown in FIG. 2A (PRIOR ART), the instrument includes an input/output (I/O) port for interfacing with external equipment, a communication port for interfacing with a remote computer, a microcontroller for system housekeeping and control of pulse shaping, the digital pulse shaping sub-system and DAC, electrical power amplification and, finally, a laser oscillator for emission of the temporally-shaped output pulses. The electronic QCW/pulse shaping module shown in FIG. 2A is further detailed in FIG. 2B (PRIOR ART). It uses double-data rate (DDR) data output and is implemented preferably in a high-end Virtex-2 Pro FPGA (tradename) from Xilinx Inc., (San Jose, Calif.) in order to generate 10-bit pulse shapes with a typical temporal resolution of 2.5 ns. DELADURANTAYE also describes how the electronic pulse shaping system can be connected to several configurations or architectures of laser oscillators.

U.S. Pat. No. 7,813,389 (PENG et al.), entitled "Generating laser pulses of prescribed pulse shapes programmed through combination of separate electrical and optical modulators" discloses a pulse shaping approach based on superposing delayed analog electrical pulses. It also points out that a fully digital approach equivalent to their analog approach can be implemented using remote computer interfacing, programmed control, digital shaping, a DAC and power amplification. This is illustrated in FIG. 2C (PRIOR ART). PENG also suggests that the digital pulse shaping can be implemented in an FPGA such as the high-end Virtex-5 (tradename) from Xilinx Inc.

The above-mentioned references teach that digital pulse shaping is preferably implemented using high-end, expensive FPGAs, therefore contributing significantly to the high cost of laser micromachining instruments. There is therefore a need for less expensive alternatives for implementing digital pulse shaping.

SUMMARY

In accordance with a first aspect of the present invention, there is provided a digital pulse shaping module for providing a digital waveform for use with a pulsed laser oscillator.

The digital pulse shaping module first includes a waveform data generator for generating at least one N-bit word having a number N of bits. The at least one N-bit word is representative of the digital waveform. A serialiser is further provided. The serialiser receives the at least one N-bit words and outputs each bit thereof individually in a series of bits corresponding to the digital waveform. Finally, a delay module provides a fine delay in the outputting of the bits of the series by the serialiser corresponding to a number of bits smaller than N.

In accordance with another aspect of the invention, there is provided a pulse shaping generator for providing a plurality of digital waveforms for use with a pulsed laser oscillator having an optical output. The pulse shaping generator includes a plurality of digital pulse shaping modules, each providing its respective digital waveform.

Each digital pulse shaping module first includes a waveform data generator for generating at least one N-bit word having a number N of bits. The at least one N-bit word is representative of the respective digital waveform. Each digital pulse shaping module further includes a serialiser receiving the at least one N-bit word from the waveform data generator and outputting each bit thereof individually in a series of bits corresponding to the respective digital waveform. Finally, each digital pulse shaping module includes a delay module providing a fine delay in the outputting of the bits of the series by the serialiser corresponding to a number of bits smaller than N.

In one embodiment, the digital waveform defines a pulse shape digital signal having a shape determinative of a shape of the optical output of the pulsed laser oscillator.

In another embodiment, the digital waveform defines a gating digital signal having a binary structure selected to gate a specific component of the pulsed laser oscillator.

In yet another embodiment, the digital waveform defines a synchronization digital signal set to be coincident with the optical output of the pulsed laser oscillator.

It will be readily understood that the pulse shaping generator may include one or more waveform data modules, each associated with a digital waveform of one of the types above in any appropriate combination.

In one particular embodiment of the invention, the pulse shaping generator may, for example, be embodied by an electronic digital platform which, under the action of a clock signal, a trigger signal and of other user-defined command signals, outputs control signals to a laser oscillator. Under the influence of such control signals, the laser oscillator may output either a QCW signal or a light pulse whose intensity is in some way proportional to the amplitude of an electrical signal defined by the digital waveform outputted by the pulse shape data generator.

Other features and advantages of the present invention will be better understood upon a reading of the preferred embodiments thereof, with reference to the appended drawings.

BRIEF DESCRIPTION OF THE DRAWINGS

FIG. 1 illustrates typical modes of operation of the optical output of a micromachining laser.

FIG. 5A is a block diagram illustrating a pulse shaping module according to an embodiment of the invention. FIG. 5B is a block diagram of a waveform data generator for the pulse shaping module of FIG. 5A.

FIGS. 6A to 6D are timing diagrams for the signals shown in FIG. 5A where the delay module induces respectively no delay (FIG. 6A), a one-bit delay (FIG. 6B), a two-bit delay (FIG. 6C) and a delay of an entire N-bit word but for one bit (FIG. 6D).

DESCRIPTION OF PREFERRED EMBODIMENTS

In accordance with one aspect of the present invention, there is provided a digital pulse shaping module for providing a digital waveform for use with a pulsed laser oscillator.

The pulsed laser oscillator to which embodiments of the invention can be applied may be a variety of devices, systems or assemblies capable of generating laser pulses. Preferably, the pulsed laser oscillator is of a type which can emit optical pulses having a temporal shape that is controllable via a pulse shaping signal. For example, several configurations of pulsed laser oscillators are shown in U.S. Pat. No. 8,073,027 (DELADURANTAYE et al.), in the section entitled "4. Pulsed laser source". The contents of this section are incorporated herein by reference. However, one skilled in the art will readily understand that the pulsed laser oscillators to which the present invention may be applied are not limited to those described in the above referenced section of DELADURANTAYE.

The digital waveform generated by the digital pulse shaping module may be any waveform useful in the operation of a laser oscillator, either by virtue of its shape, duration or timing. For example, in digital pulse shaping, the intensity of the optical pulse shape has a temporal profile that is generally determined by the amplified current or voltage signal generated by a digital electronic circuit. In such a case, the digital waveform may define a pulse shape digital signal having a shape determinative of the shape of the optical output from the laser oscillator. In another embodiment, the digital waveform may define a gating digital signal for gating a specific component of the laser oscillator. In yet another embodiment, the digital waveform may define a synchronizing digital signal that is emitted coincidentally with the optical output of the laser oscillator. Examples for each of these embodiments will be given further below.

Figure 3A:
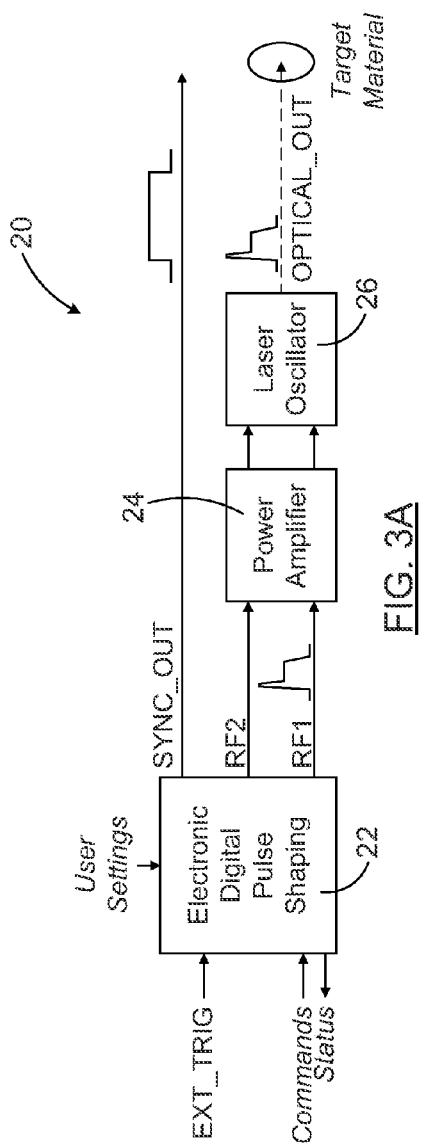
FIG. 3A is a block diagram of a laser system incorporating a pulse shaping generator according to an embodiment of the invention, as may for example be used in a micromachining tool.

In accordance with another aspect of the invention, there is provided a pulse shaping generator that generates a plurality of digital waveforms for use with a pulsed laser oscillator. FIG. 3A illustrates schematically a pulsed laser system 20 which includes such a pulse shaping generator 22. Under the action of an external trigger input signal EXT_TRIG, the pulse shaping generator 22 generates one of each of the types of signals listed above, that is, a pulse shape digital signal RF1, a gating digital signal RF2 and a synchronizing digital signal SYNC_OUT. For ease of reference, the terms RF1, RF2 and SYNC_OUT will be used to refer to signals of these three types in the description below. However, one skilled in the art will understand that this terminology is not meant to limit the scope of the invention.

The embodiment depicted in FIG. 3A also shows that the pulsed laser system 20 includes an electrical power amplifier stage 24 and a pulsed laser oscillator 26 having an optical output OPTICAL_OUT. The power amplifier stage 24 generally buffers or amplifies RF1 and RF2 in order to have sufficiently short rise time and fall time as well as sufficient output power to drive the electro-optical components integrated in the laser oscillator 26. As will be readily understood, the pulse shaping generator 22 shown in FIG. 3A may perform a variety of other functions in addition to generating the signals discussed above, such as supporting user settings, performing system housekeeping, managing a communication link with other equipment, and the like.

Figure 3B:
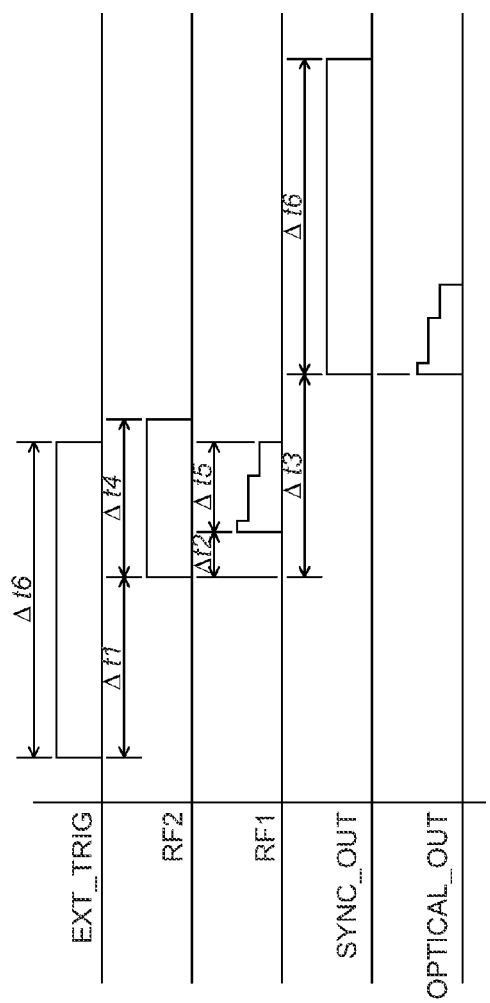
FIG. 3B is a timing diagram illustrating typical signals involved in digital pulse shaping and the timing relationships between these signals.

Referring now to FIG. 3B, there is shown a timing diagram illustrating typical temporal shapes for the RF1, RF2 and SYNC_OUT signals generated by the pulse shaping generator shown in FIG. 3A, as well as the timing relationships between these signals. The external trigger input signal EXT_TRIG and the optical output of the laser oscillator OPTICAL_OUT are also shown. It should be pointed out that the RF2, RF1 and SYNC_OUT set of signals shown in FIG. 3B is given for exemplary purposes, and is by no means restrictive. The nature, type and number of signals provided by the pulse shaping generator 22 may, for example, vary according to the system architecture or functional principle of operation of the laser oscillator 26. For example, the laser oscillator 26 may be based on a continuous-wave (CW) seed light source emitting a CW light beam pulsed by external optical modulators that are respectively controlled by RF2 and RF1. Alternatively, the laser oscillator 26 may be based on a pulsed seed light source whose drive current is directly controlled by the amplified RF1 shape signal, or having one or more internal modulators driven by RF1 and or RF2. Hence, in the context of one embodiment of the invention, RF2 may be defined as a binary digital signal whose typical purpose is to act as a gating or switching signal when controlling, for example, the RF input of a Mach-Zehnder optical modulator, or the switching on/off of an oscillating signal that drives the phase modulation of a continuous-wave seed laser. In turn, RF1 may represent the shape or QCW signal at the output of a digital-to-analog converter (DAC) that will modulate, after power amplification, the optical output of the laser oscillator. Finally, SYNC_OUT is an electrical binary output that is typically adjusted in time-coincidence with OPTICAL_OUT in order to electrically flag each emission of an optical pulse from the laser oscillator. It will, however, be understood that the RF2 and/or SYNC_OUT signals may be absent or unused in some embodiments and applications of the invention.

In this respect, one skilled in the art will readily understand that the terms "pulse shaping module" and "pulse shaping generator" are not meant to limit the use of these components to the generation of signals that define the shape of an optical pulse, as is for example the case of RF1. Such terms are contextual only, and it will be clear that devices adapted to generate signals such as RF2, SYNC_OUT or the like can still be considered "pulse shaping devices" within the meaning of the present description.

Generally, for most micromachining applications, pulse shaping generators according to embodiments of the invention should be capable of generating signals with time delays $\Delta t1$, $\Delta t2$ and $\Delta t3$ such as those illustrated in FIG. 3B, and with adequate temporal resolution, preferably in the ns time scale, with respect to EXT_TRIG. These delays may be inherent to the design of the system or may be specifically required, in different types of laser oscillators. An example of this is an optical fiber laser oscillator made up of electro-optical components such as a seed light source and an optical modulator that are linked together by a given length of optical fiber, in which the velocity of light is considered to be close to 200,000 km/s. Ideally, the electronics should delay signals in order to match exactly the propagation delay in the fiber link between the seed light source and the optical modulator. However, those familiar with the art will readily see that a delay adjusted digitally with an accuracy of 1 ns, corresponding to a length of fiber close to 20 cm, could be an acceptable alternative for some applications. Likewise, depending on the level of flexibility required in a particular laser micromachining system, delays such as $\Delta t1$, $\Delta t2$ and $\Delta t3$ may be implemented as constant factory settings, or as programmable, variable delays to be user-defined in the field. In this later case, for example, dedicated software running on a computer connected to the communication port of a micromachining tool may send a command to write a delay value in a register implemented in the pulse shaping generator.

Embodiments of the present invention may further take into consideration pulse durations $\Delta t4$ and $\Delta t5$ illustrated in FIG. 3B for RF2 and RF1. As discussed earlier, digital pulse shaping sub-systems in micromachining lasers are preferably versatile enough to generate shaped pulses of durations of a few tens of nanoseconds up to a few hundreds of nanoseconds. On the other hand, those familiar with the art know that it can be advantageous that the pulse shaping be with a temporal resolution on the order of 1 ns. Such fine temporal resolution is useful for compensating intrinsic non-linear effects occurring in electrical-to-optical conversion devices such as laser diodes and optical modulators, or optical non-linear effects such as pulse distortion induced by optical gain saturation in optical amplifiers or by harmonic generation in frequency-converted lasers. On the other hand, together with improved temporal resolution, non-linear effects are further advantageously compensated if there exists in the pulse shaping generator some supplementary fine-resolution tuning capability on the amplitude of the shape profile. For example, those familiar with the art know that some slowly-varying, long pulse shapes necessary for material engraving are advantageously generated if sufficient least-significant data bits are available for non-linearity compensation during the low-amplitude, leading edge of the shape.

Finally, those familiar with the field of laser micromachining equipment will readily appreciate that improvements that reduce the costs of manufacturing laser micromachining equipment can certainly be beneficial.

Figure 4:
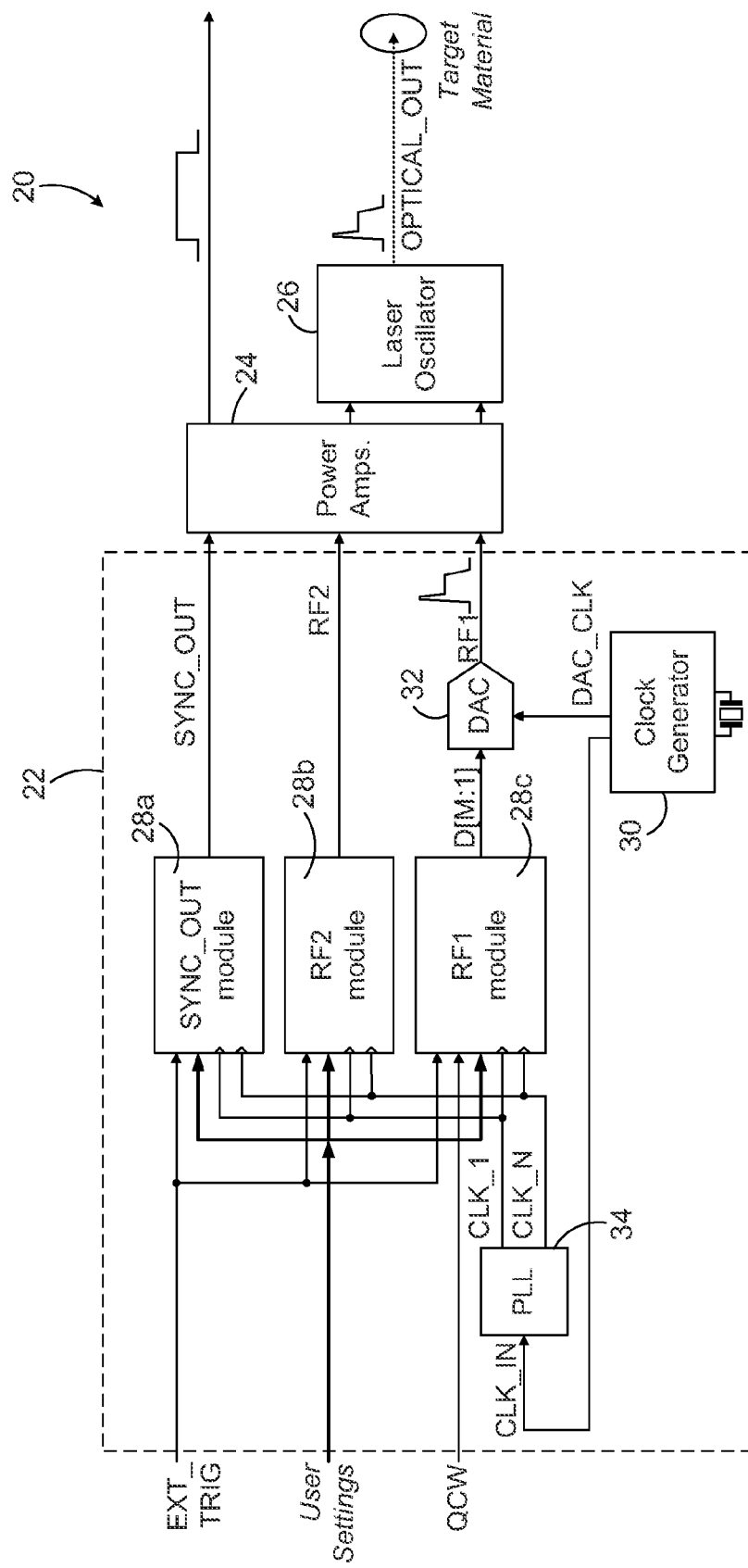
FIG. 4 is a block diagram of a pulse shaping generator implemented in a laser micromachining tool.

Referring to FIG. 4, there is shown a pulse shaping generator 22 according to an embodiment of the invention. Preferably, the pulse shaping generator 22 includes a plurality of digital pulse shaping modules 28a, 28b and 28c. In the illustrated embodiment, the plurality of digital pulse shaping modules includes a SYNC_OUT module 28a, a RF2 module 28b and a RF1 module 28c, each defining a specific generator block for generating a respective one of the signals SYNC_OUT, RF2, and RF1. Of course, one skilled in the art will readily understand that each pulse shaping module 28a, 28b and 28c can be either omitted or replicated as desired, according to the number of each of RF2, RF1 and SYNC_OUT signals that are needed for controlling a given laser oscillator. The pulse shaping generator 22 according to this embodiment of the invention is therefore scalable to many types and configurations of laser oscillators in the sense that it is based on a fundamental architecture basis that can be augmented as necessary for generating more or less complex combinations of the three types of well-defined signals identified as RF2, RF1 and SYNC_OUT.

In the illustrated embodiment, the pulse shaping generator 22 includes a clock generator 30 which uses a reference frequency, such as that of a crystal oscillator, to output two phase—and frequency—related clock signals identified here as CLK_IN and DAC_CLK. Preferably, DAC_CLK has a frequency of 1 GHz or higher and is input to a DAC 32 to enable the outputting of a pulse shaping signal RF1 with a temporal resolution of 1 ns or better. CLK_IN is phase and frequency related to DAC_CLK and is input to a clock generating module 34, such as a Phase-Locked Loop (PLL), to generate a CLK_1 clock signal and a CLK_N clock signal. CLK_1 and CLK_N are phase and frequency related to CLK_IN. CLK_N has a frequency that is equal to the frequency of DAC_CLK while being an integer multiple N of the frequency of CLK_1. Each pulse shaping module 28a, 28b and 28c is preferably clocked by both CLK_1 and CLK_N so that their outputs are tightly synchronized to each other and also to the output of the DAC 32, and this, down to the finest temporal resolution available, corresponding to the period of CLK_N.

Still referring to FIG. 4, each of the digital pulse shaping modules 28a, 28b and 28c outputs a characteristic sequence of binary data upon detection of each trig event, such as the rising edge of the system input EXT_TRIG. Referring also to FIG. 3B in the illustrated embodiment:

1) The SYNC_OUT module 28a has default output 0, will transition to 1 ($\Delta t1+\Delta t3$) s after the trig event, and will remain in this state for the same duration $\Delta t6$ as that of EXT_TRIG, after which it will transition back to 0.
2) The RF2 module 28b has default value 0, will transition to 1 $\Delta t1$ s after the trig event, and will remain in that state for a duration $\Delta t4$ s, this duration value being optionally user-defined and/or user-selectable among a set of values stored in memory, after which it will default back to 0.
3) When the input command signal QCW is logical 1, the RF1 module 28c repeatedly outputs a single M-bit data words such that the M-bit DAC outputs the QCW signal. When the QCW input is 0, the RF1 module 28c outputs a finite sequence of shape data to the DAC 32, ($\Delta t1+\Delta t2$) s after the trig event. The shape data sequence is preferably user-defined and/or user-selected among a set of shape data sequences.

The number of user-defined and user-selectable durations for RF2 is preferably equal to the number of user-defined and user-selectable shape data sequences for RF1 and, when a particular shape data sequence is selected for RF1, there is preferably a unique corresponding duration associated to that shape that is used for RF2.

FIG. 5A illustrates the basic structure of a digital pulse shaping module 28 according to one embodiment. It will be readily understood that this structure could be used to build a SYNC_OUT, RF2 or RF1 module, as explained above, or other types of signals useful for controlling the emission of a pulsed laser oscillator.

The digital pulse shaping module 28 provides a digital waveform, which preferably defines the corresponding one of the SYNC_OUT, RF1 and RF2 signals. It includes a waveform data generator 36 that generates at least one N-bit word $[a_N, a_{N-1}, \ldots, a_2, a_1]$ having a number N of bits, preferably clocked by CLK_1 and outputted at each cycle of CLK_1.

The digital pulse shaping module 28 further includes a serialiser 38 that receives the one or more N-bit words from the waveform data generator 36 and outputs each bit thereof individually in a series of bits corresponding to the digital waveform. The serialiser 38 may, for example, be embodied by a parallel-to-serial (P/S) converter that is clocked by both CLK_1 and CLK_N.

The digital pulse shaping module 28 further includes a delay module 40. The delay module 40 provides a fine delay FINE_DELAY in the outputting of the bits $a_1, a_2, \ldots, a_{N-1}, a_N$ by the serialiser 38. This fine delay impacts on the timing of the outputted signal at the bit level, that is, it corresponds to a number of bits smaller than N.

Advantageously, the basic architecture of FIG. 5A can be augmented with elements specific to each of SYNC_OUT, RF2 and RF1, and which is also capable of implementing temporal synchronization and delays with high resolution with respect to the EXT_TRIG input.

Referring to FIG. 5B, in one embodiment the waveform data generator 36 includes a state-machine 60 that receives the FINE_DELAY and the TRIG input commands. The waveform generator 36 further includes an N-bit, O_N output register 62, and a (N−1)-bit TEMP register 64. In this embodiment, the waveform data generator may operate as follows. In the absence of a trig event, the state-machine 60 writes at each CLK_1 cycle, by convention, the all-zero words [0, 0, . . . , 0] to both the TEMP and O_N registers. Upon a trig event, the state-machine 60 writes 0 bits according to the desired fine delay in the O_N register 62, as well as the first bits from the first N-bit word to be outputted. The remainder of the first N-bit word is written in the (N−1)-bit TEMP register 64, from which they are copied into the O_N register 62 upon the next CLK_1 cycle. At each CLK_1 cycle subsequent to the first one, the O_N register 62 therefore received the leftover bits from the TEMP register as well as the first bits from the next N-bit word, until all bits have been outputted.

By way of example, the digital pulse shaping module 28 of FIGS. 5A and 5B may operate as follows.

At each cycle of CLK_1, the waveform data generator 28 generates at least one N-bit word. A sequence of multiple N-bit words can, for example, have the structure:

$[a_N, a_{N-1}, \ldots, a_2, a_1]$,
$[b_N, b_{N-1}, \ldots, b_2, b_1]$,
. . .
$[z_N, z_{N-1}, \ldots, z_2, z_1]$ In the absence of a trig event, the N-bit words preferably default, by convention, to [0, 0, . . . , 0]. On the other hand, a finite non-zero sequence may be representative of either SYNC_OUT, RF2 and RF1, i.e., the number of N-bit words in the sequence and the 0/1 bit composition of each word are arranged so that their rearranging by the serialiser will yield the desired digital waveform. Also by convention, a number of zero bits corresponding to the value of FINE_DELAY input to the data generator 36 is added preceding the first N-bit word, thus shifting the entire sequence of bits for all the N-bit words. Therefore, on each occurrence of a trig event on the TRIG input, the generator outputs a finite sequence of shifted N-bit words at the O_N output.

Using the waveform data generator 36 such as shown in FIG. 5B, the delayed N-bit words may be generated according to the following technique. When a trig event occurs on TRIG, the state-machine 60 follows a rule to write in O_N and TEMP, a sequence of N-bit data words $[a_N, a_{N-1}, \ldots, a_2, a_1]$ at the rate of CLK_1. In the first cycle of CLK_1 following the trig event and supposing that FINE_DELAY=n, the state-machine writes in the rightmost bits of the O_N register a number n of zeros. In the same cycle of CLK_1, the state-machine also writes in the (N−n) leftmost bits of O_N the (N−n) rightmost bits $[a_{N-n}, \ldots, a_2, a_1]$. Still in the same cycle of CLK_1, the state-machine writes the n leftmost bits $[a_N, \ldots, a_{N-n+1}]$ in the n rightmost bits of TEMP. At the following cycle of CLK_1, the state-machine writes these n rightmost bits $[a_N, \ldots, a_{N-n+1}]$ in the n rightmost bits of O_N, it writes the (N−n) bits $[b_{N-n}, \ldots, b_2, b_1]$ of the next N-bit word in the (N−n) leftmost bits of O_N and finally, it writes the n leftmost bits $[b_N, \ldots, b_{N-n+1}]$ in the n rightmost bits of TEMP. And this ongoing, until all the N-bit words have been written in the O_N and TEMP registers, after which the state-machine writes, by convention, the default all-zero word $[0, 0, \ldots, 0]$ into both the O_N and TEMP registers.

For example, for FINE_DELAY=2, the shifted sequence at the output of the generator would have the following structure:

$[a_{N-2}, a_{N-3}, \ldots a_2, a_1, 0, 0]$,
$[b_{N-2}, b_{N-3}, \ldots, b_2, b_1, a_N, a_{N-1}]$,
...
$[z_{N-2}, z_{N-3}, \ldots, z_2, z_1, y_N, y_{N-1}]$
$[0, 0, \ldots, 0, 0, z_N, z_{N-1}]$ At each cycle of the slow clock CLK_1, an N-bit word in the shifted sequence shown above is outputted by the data generator 36 to the I_N input of the serialiser 38 and then outputted bit-by-bit by this serialiser at output O_1, at the rate of the fast CLK_N and, by convention, with the rightmost bit of an N-bit word being output first. This sequence of operations is illustrated in greater details in the timing diagram of FIG. 6C for this particular example of FINE_DELAY=2. Output sequences for FINE_DELAY=0, FINE_DELAY=1, and up to FINE_DELAY=(N−1) are also illustrated, respectively in FIGS. 6A, 6B and 6D.

It will be noted that the serialiser-based implementation set out above is adapted for generating signals that are compatible with known DAC designs, such as the DAC5681 from Texas Instruments, (Phoenix, Ariz.), as exemplified in the data sheet SLLS864A for this device. Of course, the implementation in different systems may differ depending on the requirements of such systems.

Figure 7:
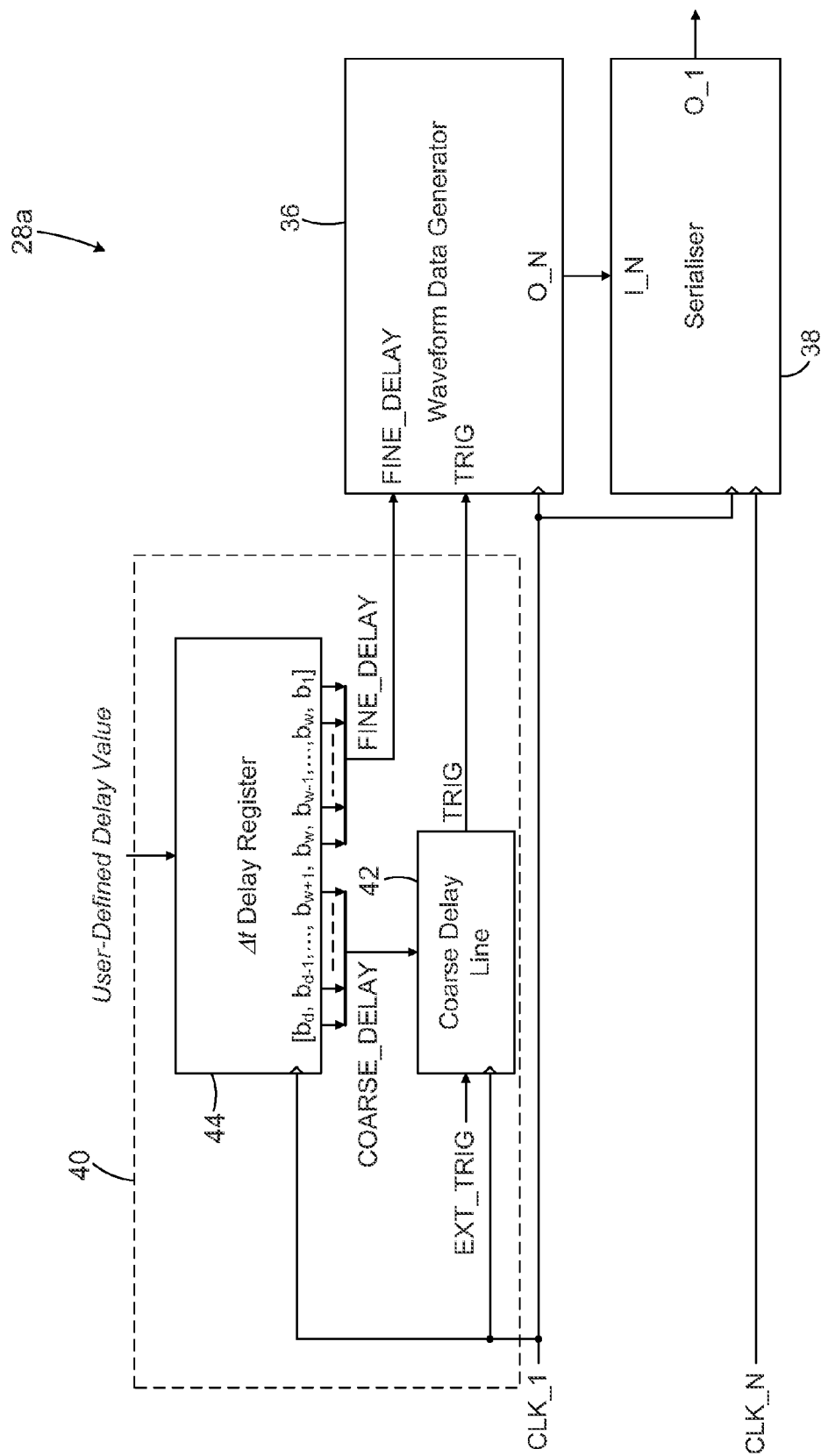
FIG. 7 is a block diagram of a digital pulse shaping module according to an embodiment of the invention, adapted to generate a synchronization digital signal.

Referring to FIG. 7, according to an embodiment of the invention, there is shown a digital pulse shaping module embodying a SYNC_OUT module 28a, therefore apt to generate a digital waveform defining a synchronizing digital signal SYNC_OUT set in time-coincidence with the optical output of a pulsed laser oscillator.

Figure 2A:
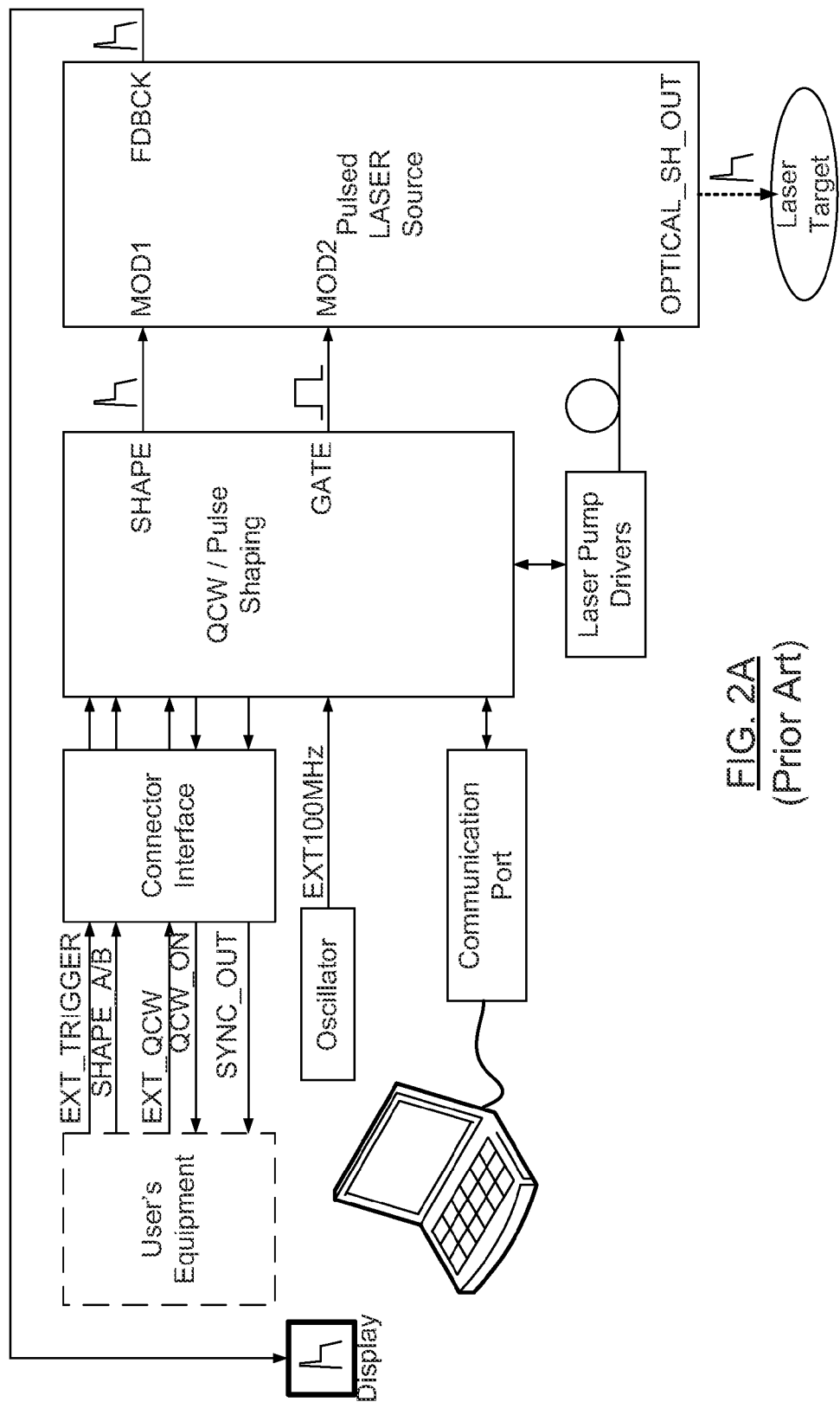
FIG. 2A (PRIOR ART) is a high-level block diagram of a digital pulse shaping system according to prior art.
Figure 2B:
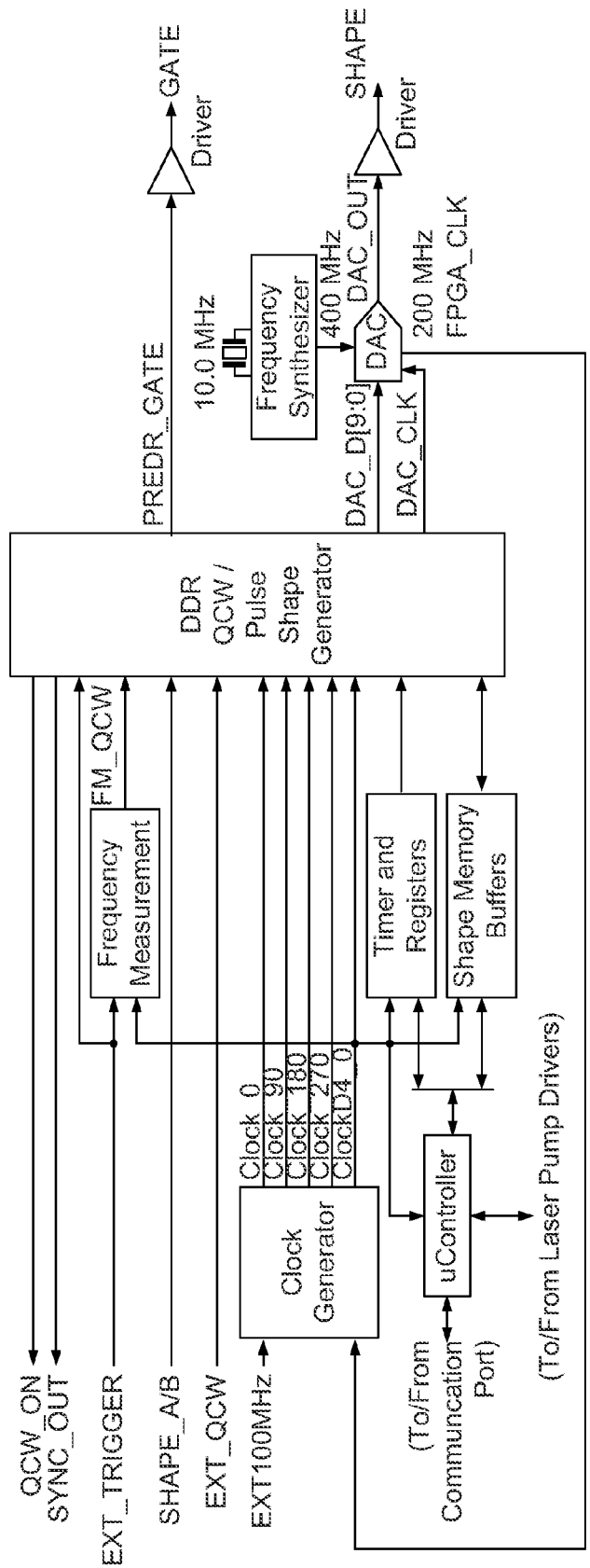
FIG. 2B (PRIOR ART) is a detailed block diagram of the digital QCW/Pulse Shaping module appearing in the system of FIG. 2A.
Figure 2C:
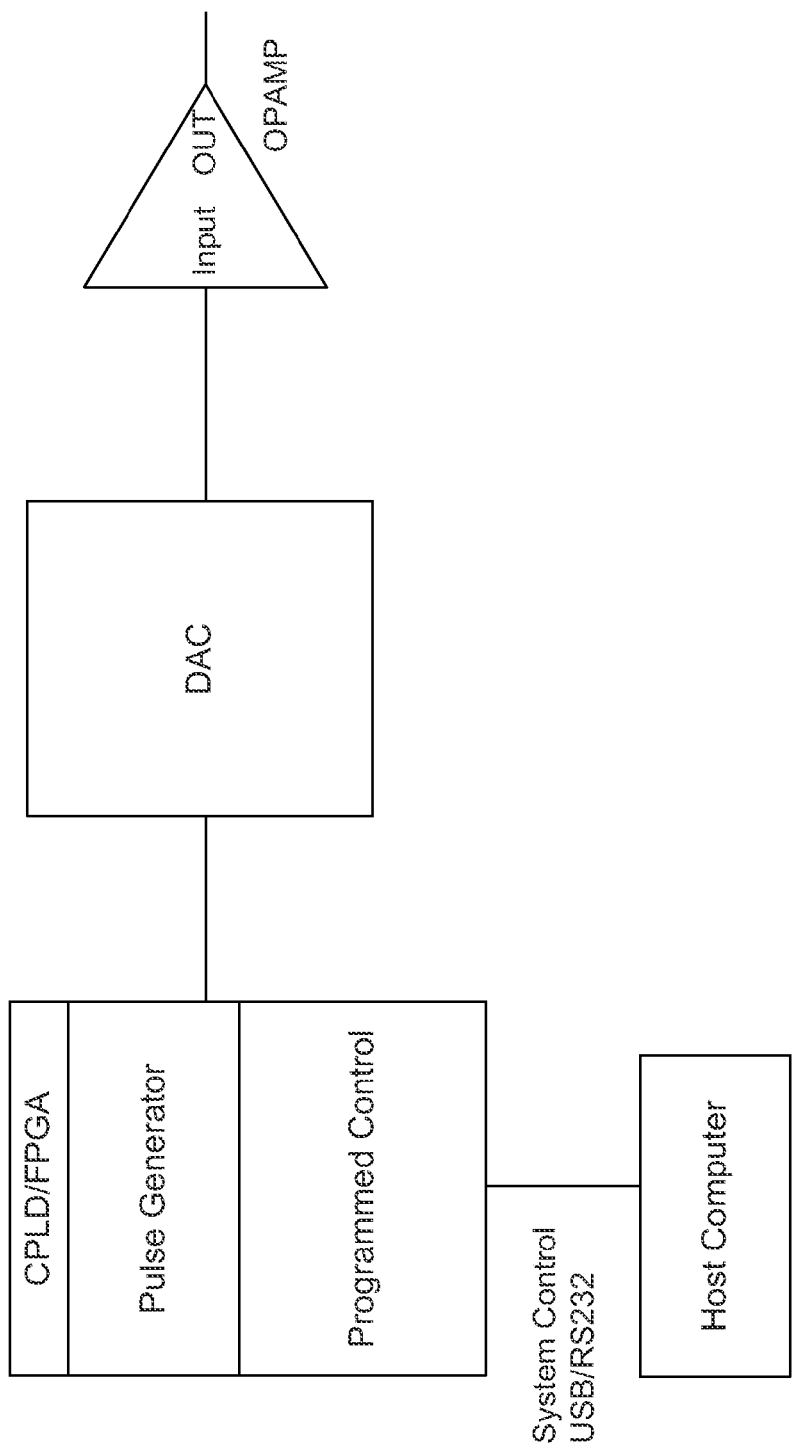
FIG. 2C (PRIOR ART) is a block diagram of another prior art digital pulse shaping system.

As explained above, the SYNC_OUT module includes a waveform data generator 36, a serialiser 38 and a delay module 40. In the illustrated embodiment, the delay module 40 includes a coarse delay line 42 and a d-bit delay register 44 programmable to store a value for the fine delay. The delay register 44 is, for example, used for programming user-defined delays such as $\Delta t1$, $\Delta t2$ and $\Delta t3$ as shown in FIG. 2B. By definition, the delay register stores any delay value $\Delta t$ as a d-bit integer $[b_d, b_{d-1}, \ldots, b_{w+1}, b_w, b_{w-1}, \ldots, b_2, b_1]$ of cycles of the fast CLK_N. If we set $N=2^w$, or equivalently, $w=\log_2(N)$, the registered $\Delta t$ delay value is separable by a COARSE_DELAY number $[b_d, b_{d-1}, \ldots, b_{w+1}]$ of cycles of the slow CLK_1 and a FINE_DELAY number $n=[b_w, b_{w-1}, \ldots, b_2, b_1]$ of cycles of the fast CLK_N. The EXT_TRIG is input to the delay line and its current value appears as TRIG at the output of the delay line after a number of CLK_1 cycles that is equal to the value of COARSE_DELAY. It is to be noted that the use of a coarse delay line with output TRIG, as illustrated in FIG. 7, is for a better conceptual understanding of the invention only, and that it can be implemented differently, for example as a counting loop triggered by EXT_TRIG.

Figure 8:
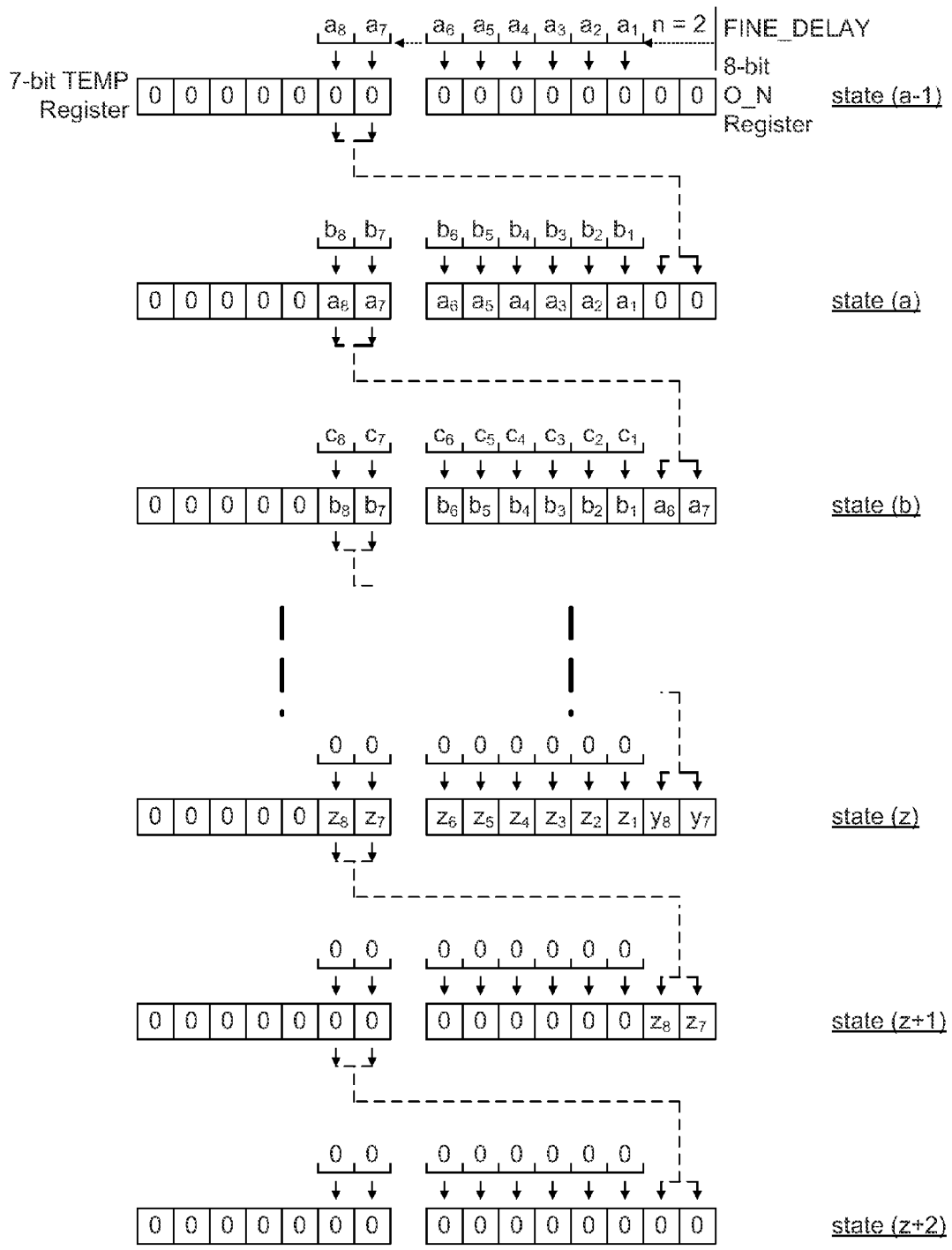
FIG. 8 illustrates the sequential operation of an N-bit data generator having a 2-register structure.

The delay module 40 is coupled to the waveform data generator 36 to provide the value for the fine delay thereto, and the waveform data generator 36 incorporates a number of zero bits in the N-bit words according to the value for the fine delay when there is a trig event on the TRIG input. In one embodiment, the rule may be set up as follows:

if n=0, the waveform data generator 36 outputs the N-bit words as:

$[a_N, a_{N-1}, \ldots, a_2, a_1]$,
$[b_N, b_{N-1}, \ldots, b_2, b_1]$,
...
$[z_N, z_{N-1}, \ldots, z_2, z_1]$ In this case, no delay is requested and the sequence of N-bit words transferred from the O_N output of the data generator 36 to the I_N input of the serialiser 38 does not include any zero. The bitstream at the output O_1 of the serialiser 28, therefore, has no delay included and will have the structure:

$\ldots, 0, 0, [a_1, a_2, \ldots, a_N, b_1, b_2, \ldots, b_N, \ldots, z_1, z_2, \ldots, z_N], 0, 0, \ldots$ where the logical zeros out of the brackets are by convention the default value of O_1 before and after the data in the N-bit words has been serialized by the serialiser.

if n=1, the data generator 36 outputs the N-bit words as the shifted sequence:

$[a_{N-1}, \ldots, a_2, a_1, 0]$,
$[b_{N-1}, \ldots, b_2, b_1, a_N]$,
$[c_{N-1}, \ldots, c_2, c_1, b_N]$,
...
$[z_N, z_{N-1}, \ldots, z_1, y_1]$
$[0, 0, \ldots, 0, z_N]$ This generates at O_1 the bitstream with the first bit a logical 0 or equivalently, the bitstream now delayed by one period of $T_N$ s:

$\ldots, 0, 0, [0, a_1, a_2, \ldots, a_N, b_1, b_2, \ldots, b_N, \ldots, z_1, z_2, \ldots, z_N], 0, 0, \ldots$ The brackets are used so as to emphasize the delaying effect of the logical zeros now present as rightmost bit in the first word, $[a_{N-1}, \ldots, a_1, 0]$, and also that the (N−1) logical 0's in the last word, $[0, 0, \ldots, 0, z_N]$, are effectively merged with the default-valued bitstream that follows (by definition) the sequence of output words. Of course, this convention is used by way of example only, and is not considered limitative to the scope of the invention.

if n=2, the data generator 36 outputs the N-bit words according to the shifted sequence:

$[a_{N-2}, \ldots, a_2, a_1, 0, 0]$,
$[b_{N-2}, \ldots, b_2, b_1, a_N, a_{N-1}]$,
$[c_{N-1}, \ldots, c_2, c_1, b_N, b_{N-1}]$,
...
$[z_{N-2}, \ldots, z_1, y_1, y_2]$
$[0, 0, \ldots, 0, z_N, z_{N-1}]$ with the corresponding bitstream below delayed by 2 periods of $T_N$ s at the output O_1 of the serialiser:

$\ldots, 0, 0, [0, 0, a_1, a_2, \ldots, a_N, b_1, b_2, \ldots, b_N, \ldots, z_1, z_2, \ldots, z_N], 0, 0, \ldots$ and so on for each other value of n, up to $n=(2^w-1)=(N-1)$. In the latter case, the data generator 36 outputs the shifted sequence:

$[a_1, 0, 0, \ldots, 0]$,
$[b_1, a_N, a_{N-1}, \ldots, a_2]$,
$[c_1, b_N, b_{N-1}, \ldots, b_2]$,
...
$[z_1, y_N, y_{N-1}, \ldots, y_2]$
$[0, z_N, z_{N-1}, \ldots, z_2]$ with the corresponding bitstream below delayed by (N−1) periods of $T_N$ s at the output O_1 of the serialiser:

$\ldots, 0, 0, [0, 0, \ldots, 0, a_1, a_2, \ldots, a_N, b_1, b_2, \ldots, b_N, \ldots, z_1, z_2, z_N], 0, 0, \ldots$ Referring now to FIG. 8, in an exemplary embodiment, the rule using the value n of FINE_DELAY for shifting a given sequence of N-bit output words, for example,

[$a_N, a_{N-1}, \ldots, a_2, a_1$],
[$b_N, b_{N-1}, \ldots, b_2, b_1$],
. . .
[$z_N, z_{N-1}, \ldots, z_2, z_1$]

can be implemented in an appropriate data generator by using an (N−1)-bit TEMP register and the N-bit O_N output register of the generator, such as shown in FIG. 5B. FIG. 8 illustrates a particular case where N=8, n=2 and where N-bit words are written sequentially, with TEMP and O_N starting in a state arbitrarily called (a−1) with a default value [0, 0, . . . , 0] and ending in state (z+2) with same default value.

With both TEMP and O_N registers initially in the default state [0, 0, . . . , 0], N-bit words are outputted sequentially at each CLK_1 cycle following a placement of the bits such that
 1) the current n rightmost bits of TEMP are transferred into the n rightmost bits of O_N.
 2) the remaining leftmost (N−n) bits of O_N are replaced by the (N−n) rightmost bits of the current N-bit word to output.
 3) the n rightmost bits of TEMP are replaced by the n leftmost bits of the current N-bit word to output.

and this is ongoing, until the last N-bit word has been outputted, after which the N-bit [0, 0, . . . , 0] is outputted according to the value of n until both TEMP and O_N registers transition back to the default output [0, 0, . . . , 0].

As one skilled in the art will readily understand, the architecture shown in FIG. 7 is sufficient for generating the SYNC_OUT signal. Referring to FIG. 3B, SYNC_OUT is shown as transitioning with a delay of ($\Delta t1 + \Delta t3$) s after the triggering event on EXT_TRIG in order to flag the occurrence of the OPTICAL_OUT optical output from the laser oscillator. The delay value ($\Delta t1 + \Delta t3$) is preferably written as an integer number of cycles of CLK_N in the delay register 44 of FIG. 7 so that it will be partitioned as a COARSE_DELAY and a FINE_DELAY. On the other hand, it can be assumed that the EXT_TRIG input is synchronous with CLK_1 or, equivalently, that it is in the logical 1 state for $\Delta t6$, an integer number k of cycles of CLK_1, which duration is identical to (k×N) cycles of CLK_N. This means that when the data generator 36 detects a triggering event on TRIG, it will repeatedly output the N-bit word [1, 1, . . . , 1] delayed in accordance with the FINE_DELAY value. It will remain in this mode until it detects that TRIG transitions back to its default inactive state.

Figure 9:
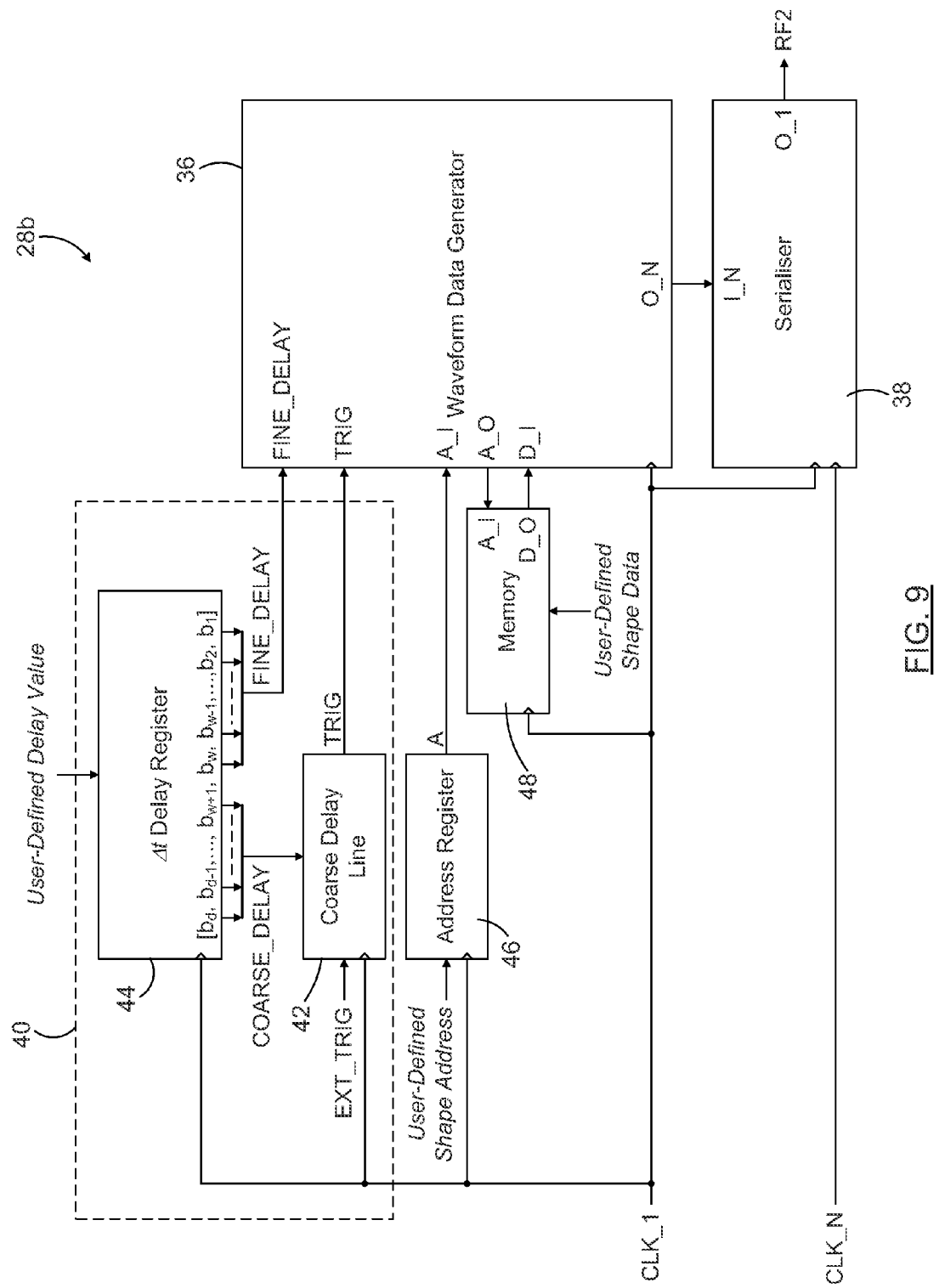
FIG. 9 is a block diagram of a digital pulse shaping module according to an embodiment of the invention, adapted to generate a gating digital signal.

Referring to FIG. 9, there is shown an example of a digital pulse shaping module embodying a RF2 module 28b, which may therefore be used for generating a gating digital signal RF2 having a binary structure selected to gate a component of the pulsed laser oscillator.

It may be desirable, for example in a laser micromachining equipment, to provide some capability for switching the optical output among a set of different predetermined pulse shapes. In this context, it may be advantageous to provide a memory space for storing data defining a given number of shapes altogether with a register for storing the beginning address of the selected shape. Moreover, it is generally also advantageous to think of RF2 as a binary output signal whose duration is associated with the shape currently selected. Therefore, the embodiment illustrated in FIG. 9 shows that the RF2 module 28b has the same basic structure as the SYNC_OUT module 28a depicted in FIG. 7. It however further includes a pulse duration memory 48, in communication with the waveform data generator 36, and storing one or more pulse durations, and an address register 46 for storing an address of a selected one of the pulse durations within the pulse duration memory 48 and providing this address to the waveform data generator 36. The address register 46 outputs an address A which is inputted to the data generator 36. With this information, the data generator 36 reads the corresponding pulse duration from the pulse duration memory 48 and, starting on the TRIG event, it will output an N-bit word sequence in accordance with the duration data and the FINE_DELAY data.

The pulse duration $\Delta t4$ stored in the pulse duration memory 48 represents an integer number t of cycles of CLK_N. Therefore, t can be expressed equivalently as a unique pair of integers (u, v), where u is the greatest integer such that $$(u \times N) \leq t,$$

and $$v = t - (u \times N), \; 0 \leq v \leq (N-1).$$

Hence, the N-bit word sequence generated for RF2 is, first, to repeatedly output on O_N during u, possibly 0, CLK_1 cycles, and according to the value n in FINE_DELAY, the all 1's, N-bit word [1, 1, . . . , 1], and then a single N-bit word according to the value of v such that v=0→O_N=[0, 0, . . . , 0, 0]
 v=1→O_N=[0, 0, . . . , 0, 1]
 . . .
 v=(N−1)→O_N=[0, 1, 1, . . . , 1, 1]

It must be noted that the hardware implementation shown for RF2 in FIG. 9 could be simplified in alternative embodiments, such as by eliminating both address register 46 and pulse duration memory 48. Likewise, the simplification can be carried out by reducing the implementation according to a single, hard-coded constant, or by eliminating the pulse duration memory 48 and replacing the address register 46 by a single, programmable pulse-length register.

Figure 10:
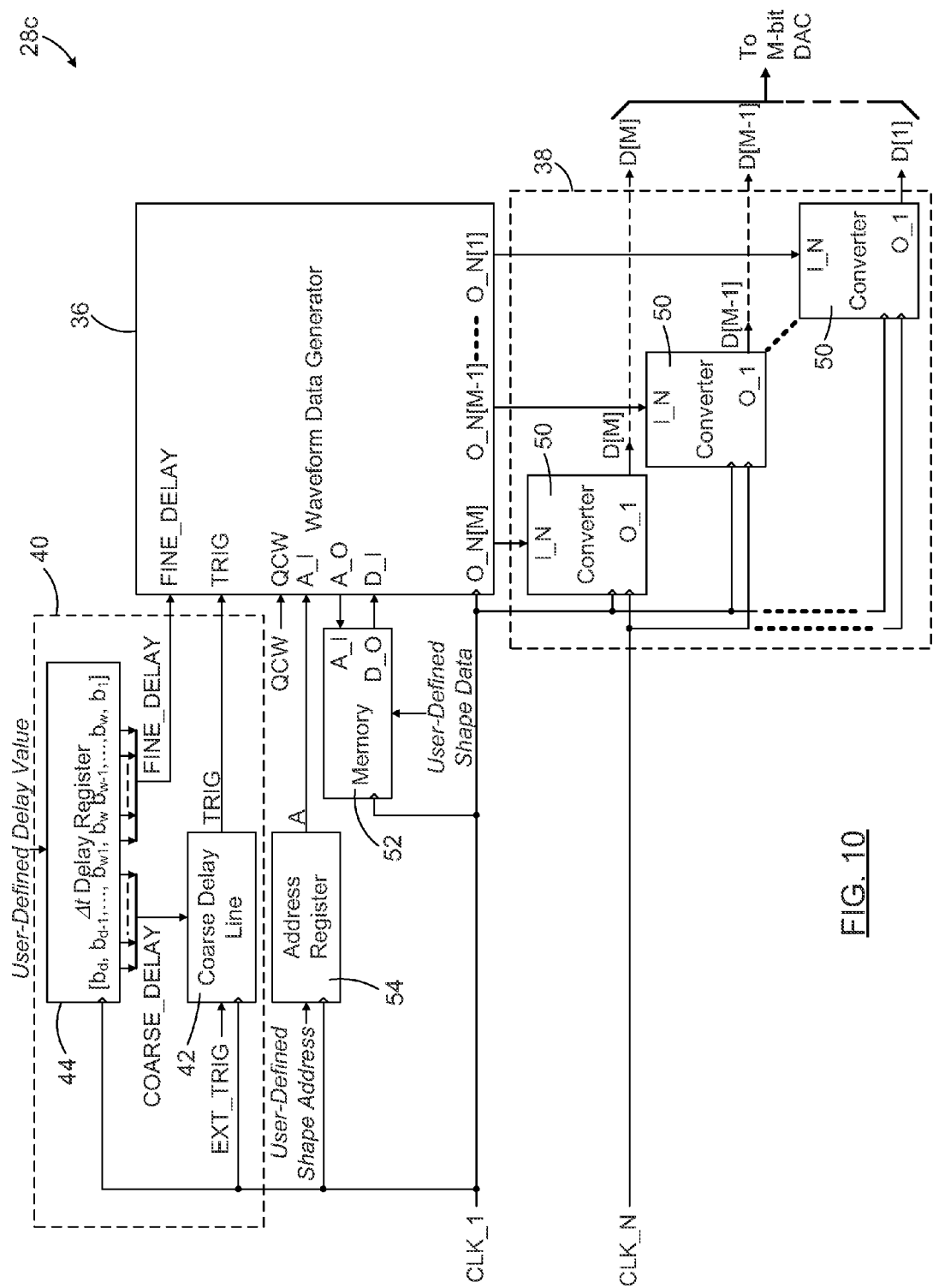
FIG. 10 is a block diagram of a digital pulse shaping module according to an embodiment of the invention, adapted to generate a pulse shape digital signal.

Referring now to FIG. 10, there is shown an embodiment of an RF1 module 28c. In this embodiment, the digital waveform defines a pulse shape digital signal RF1 having a shape determinative of the shape of the optical output of the pulsed laser oscillator. In this embodiment, the serialiser 38 of the RF1 module 28c is preferably embodied from M P/S converters 50 so that the series of bits is outputted as a number M of parallel digital samples D[M], D[M−1], . . . , D[1]. The waveform data generator 36 therefore outputs data to the P/S converters 50 in parallel, so that the output bitstream of each converter 50 is used as one of the M single-bit inputs to the DAC.

The RF1 module 28c preferably includes a pulse shape memory 52, in communication with the waveform data generator 36, for storing one or more pulse shapes and an address register 54 for storing an address of a selected shape within the pulse shape memory 52 and providing this address to the waveform data generator 36. On each trig event on TRIG, the data generator 36 sequentially reads a given number of (M×N)-bit data words from the pulse shape memory 52 and outputs on each of O_N[M], O_N[M−1], O_N[1] a N-bit word delayed in accordance with the value n in FINE_DELAY. We can write as [$d_{(M,N)}, d_{(M,N-1)}, \ldots, d_{(M,1)}$] the N-bit data word that is received and serialized by the P/S converter 50 with output D[M], [$d_{(M-1,N)}, d_{(M-1,N-1)}, \ldots, d_{(M-1,1)}$], the N-bit word serialized by the P/S converter 50 with output D[M−1], and so on, down to [$d_{(1,N)}, d_{(1,N-1)}, \ldots, d_{(1,1)}$] the N-bit word that is serialized by the P/S converter 50 with output D[1]. Since by convention, each of the P/S converters 50 outputs the rightmost bit first, it should be clear that the M-bit words output to the DAC will appear in the following order $[d_{(M, 1)}, d_{(M-1, 1)}, \ldots, d_{(1, 1)}]$
$[d_{(M, 2)}, d_{(M-1, 2)}, \ldots, d_{(1, 2)}]$
$\ldots$
$[d_{(M, N-1)}, d_{(M-1, N-1)}, \ldots, d_{(1, N-1)}]$
$[d_{(M, N)}, d_{(M-1, N)}, \ldots, d_{(1, N)}]$
from which those skilled in the art will easily deduce how shape data must be stored in the pulse shape memory 52 in order to be faithfully outputted by the DAC as the RF1 signal.

Optionally, an input QCW can also be provided on the data generator 36 in order to be able to force the DAC output into a QCW mode, as explained above. As a simple example, the QCW output mode can be defined as forcing the output of the DAC to oscillate with a 50% duty-cycle between a full-scale value and a default 0 value. In such a case, the input of the DAC preferably receives at 50% duty-cycle each of the M-bit full-scale value [1, 1, ..., 1, 1] and the M-bit default null value [0, 0, ..., 0]. This requires that when the QCW input is asserted active, the data generator 36 repeatedly writes in all of the M P/S converters 50 a single N-bit word [1, 1, ..., 1, 0, 0, ..., 0] with an equal number of (N/2) logical 1's and (N/2) logical 0's, hence providing the required 50% duty-cycle at the output of the DAC.

As one skilled in the art will readily understand from a reading of the present description, the digital pulse shaping module as shown in FIG. 5A can easily be adapted for the generation of a variety of waveforms, such as the RF1, RF2 and SYNC_OUT signals and the like. Furthermore, it is very well suited for a variety of low-cost implementations of digital pulse shaping. For example, low-cost FPGA's, such as the Spartan-6 from Xilinx Inc. (tradename), have P/S converters located in the I/O blocks (10B) of the device. These can be used with different clock/data-width ratios ranging from N=2 to N=8. Advantageously, these P/S converters can be clocked at a frequency as high as 1 GHz. Hence, provided that the maximum ratio available N=8 is used, the pulse shaping can be performed with the (slow) N-bit data generator of FIG. 5A clocked at 100 MHz—this frequency being slow enough for the logic fabric of the device—and the P/S converter output clocked at 800 MHz for generating shape data with a temporal resolution of 1.25 ns.

Referring back to FIG. 4, as one skilled in the art will readily understand, a laser system 20 incorporating pulse shaping modules such as the RF1, RF2 and SYNC_OUT modules 28a, 28b and 28c may be particularly advantageous for a number of applications, such as, but not limited to, laser micromachining tools. Each pulse shaping module may be independently controllable and programmable by the user with its specific user settings such as delay values, shape address, pulse length and shape data. To achieve a temporal resolution of 1.25 ns, a clock generator device such as the CDCM7005 (tradename) from Texas Instruments Inc., (Dallas, Tex.) may be used. This generator outputs two phase and frequency related clock signals, the 200-MHz CLK_IN and the 800-MHz DAC_CLK, in order to tightly synchronize the RF1 generator and a high-speed DAC, such as for example the 14-bit AD9736 (tradename) from Analog Devices Inc., (Norwood, Mass.). The DAC converts the M-bit D[M:1] digital samples outputted from the RF1 generator into the RF1 electrical shape signal. As explained above, an embodiment of the invention is advantageously implemented in a low-cost FPGA such as the Spartan-6 from Xilinx Inc. Hence, the PLL and each of the SYNC_OUT, RF2 and RF1 generators are preferably implemented in this component. Also, for a temporal resolution of 1.25 ns, the PLL converts the incoming 200-MHz CLK_IN into an 800-MHz CLK_N for the P/S converters, and an 100-MHz CLK_1 in order to clock the logic in the FPGA fabric at the lowest frequency possible.

Hence the reason for the frequency/data-width ratio N=8. On the other hand, the delays Δt1, Δt2, and Δt3 and pulse durations Δt4, Δt5, and Δt6 can be chosen to last from 1.25 ns to a few μs without real practical limit, except for the shape duration Δt5, for which the memory space available for storing the shape data could be limited in the context of a low-cost instrument. The power amplifier stage 24 preferably comprises buffers for SYNC_OUT as well as high-bandwidth amplifiers, such as for example the THS3201 (tradename) from Texas Instruments Inc., for RF1 and RF2. Once properly amplified, RF1 and RF2 are ready for controlling the internal architecture of the laser oscillator 26 in order to output the OPTICAL_OUT shape signal. Of course, it will be readily understood that the architecture and components given herein are for exemplary purposes only, and that the invention is scalable to many configurations or types of laser oscillators.

For laser micromachining tools, an FPGA-based approach is usually considered as the best one to benefit from the advantage of scalability contemplated in the applications mentioned above. In U.S. Pat. No. 8,073,027 (DELADURANTAYE et al.), a high-end FPGA, with a working clock frequency that may be as high as 250-300 MHz, is used in DDR for pulse shaping with a temporal resolution of 2.5 ns. When compared to a high-end FPGA, however, a low-end FPGA suffers from longer propagation delays in the logic fabric of the device. This translates to a much lower is working clock frequency for a given application, which is not much faster than 125-150 MHz. Those skilled in the art will recognize that the embodiments of the invention disclosed above address these issues and are capable of achieving a temporal resolution close to 1 ns when implemented in a low-cost FPGA, hence providing a significant cost reduction in the manufacturing of laser micromachining tools while providing improved and more flexible performance specifications with respect to the prior art.

The present invention is, however, by no means restricted to implementation in low-cost FPGAs. In various applications, it may be acceptable to implement digital pulse shaping using electronic components that are more expensive than low-cost FPGAs and that will provide still better performance, such as a temporal resolution better than 1 ns. Those skilled in the art are well aware of a number of electronic components that can be adapted to embody the components of the present invention to provide the desired temporal resolution at a reasonable cost. For example, a synchronous implementation can be done using a Complex Programmable Logic Device (CPLD), a PLL, a random-access memory (RAM) and a parallel-to-serial converter such as the MC100EP446 (tradename) from ON Semiconductor (Phoenix, Ariz.). Another alternative is an application-specific integrated circuit (ASIC). The CPLD approach may be suitable for some low-cost applications. However, it can be quite cumbersome in terms of low-level integration, it is likely to be too slow to achieve temporal resolution at the nanosecond scale and finally, it lacks scalability. The ASIC approach, although technically acceptable, entails the high costs of non-recurrent engineering that may be incompatible with the production volumes currently known in the field of laser micromachining tools. Nevertheless, this option must not be neglected, since future price reductions of the electro-optical components such as lasers and modulators could contribute significantly in reducing the production costs of laser tools.

Of course, numerous modifications could be made to the embodiments described above without departing from the scope of the present invention as defined in the appended claims.

The invention claimed is:

1. A digital pulse shaping module for providing a digital waveform for use with a pulsed laser oscillator, comprising:
a waveform data generator for generating at least one N-bit word having a number N of bits, said at least one N-bit word being representative of said digital waveform;
a serialiser receiving said at least one N-bit word and outputting each bit thereof individually in a series of bits corresponding to the digital waveform; and
a delay module providing a fine delay in the outputting of the bits of said series by the serialiser corresponding to a number of bits smaller than N, the delay module being coupled to the waveform data generator to provide a value for the fine delay to said waveform data generator, the waveform data generator incorporating a number of zero bits in said at least one N-bit word according to said value for the fine delay.

2. The digital pulse-shaping module according to claim 1, wherein the delay module comprises a delay register programmable to store the value for said fine delay.

3. The digital pulse-shaping module according to claim 1, wherein said value for the fine delay is user-defined.

4. The digital pulse shaping module according to claim 1, wherein the waveform data generator comprises a state machine generating said at least one N-bit word, an output register for storing the bits of a current one of the N-bit words in accordance with said fine delay and a TEMP register for storing leftover bits from said current one of the N-bit words.

5. The digital pulse shaping module according to claim 1, wherein the series of bits outputted by the serialiser defines a pulse shape digital signal determinative of a shape of an optical output of the pulsed laser oscillator.

6. The digital pulse shaping module according to claim 5, further comprising:
a pulse shape memory, in communication with the waveform data generator, for storing one or more pulse shapes; and
an address register for storing an address of a selected shape within said pulse shape memory and providing said address to the waveform data generator.

7. The digital pulse shaping module according to claim 5, wherein the serialiser outputs the series of bits corresponding to the pulse shape digital signal as a number M of parallel digital samples.

8. The digital pulse shaping module according to claim 7, wherein the serialiser comprises a plurality of parallel-to-serial converters each outputting a corresponding one of said digital samples.

9. The digital pulse shaping module according to claim 1, wherein the series of bits outputted by the serialiser defines a gating digital signal having a binary structure selected to gate a component of the pulsed laser oscillator.

10. The digital pulse shaping module according to claim 9, further comprising:
a pulse duration memory, in communication with the waveform data generator, for storing one or more pulse durations; and
an address register for storing an address of a selected one of the pulse durations within said pulse duration memory and providing said address to the waveform data generator.

11. The digital pulse shaping module according to claim 1, wherein the series of bits outputted by the serialiser defines a synchronizing digital signal set to be coincident with an optical output of the pulsed laser oscillator.

12. A pulse shaping generator for providing a plurality of digital waveforms for use with a pulsed laser oscillator having an optical output, comprising a plurality of digital pulse shaping modules, each providing a respective one of said digital waveforms, each digital pulse shaping module comprising:
a waveform data generator for generating at least one N-bit word having a number N of bits, said at least one N-bit word being representative of said respective digital waveform;
a serialiser receiving the at least one N-bit word from the waveform data generator and outputting each bit thereof individually in a series of bits corresponding to the respective digital waveform; and
a delay module providing a fine delay in the outputting of the bits of said series by the serialiser corresponding to a number of bits smaller than N, the delay module being coupled to the corresponding waveform data generator to provide a value for the fine delay to said corresponding waveform data generator, the corresponding waveform data generator incorporating a number of zero bits in the corresponding at least one N-bit word according to said value for the fine delay.

13. The pulse shaping generator according to claim 12, wherein the delay module of each digital pulse shaping module comprises a delay register programmable to store the value for said fine delay.

14. The pulse shaping generator according to claim 12, wherein said value for the fine delay is user-defined.

15. The pulse shaping generator according to claim 12, wherein the waveform data generator of each digital pulse shaping module comprises a state machine generating said at least one N-bit word, an output register for storing the bits of a current one of the N-bit words in accordance with said fine delay and a TEMP register for storing leftover bits from said current one of the N-bit words.

16. The pulse shaping generator according to claim 12, wherein the respective digital waveform associated with at least one of the plurality of waveform data generators defines a pulse shape digital signal determinative of a shape of said optical output of the pulsed laser oscillator.

17. The pulse shaping generator according to claim 16, further comprising:
a pulse shape memory, in communication with the waveform data generator associated with the pulse shape digital signal, for storing one or more pulse shapes; and
an address register for storing an address of a selected shape within said pulse shape memory and providing said address to the corresponding waveform data generator.

18. The pulse shaping generator according to claim 16, in combination with a digital-to-analog converter receiving the pulse shape digital signal and converting the same into an equivalent pulse shape analog signal.

19. The pulse shaping generator according to claim 18, wherein the serialiser outputs the series of bits corresponding to the pulse shape digital signal as a number M of parallel digital samples adapted for conversion by the digital-to-analog converter.

20. The pulse shaping generator according to claim 19, wherein the serialiser comprises a plurality of parallel-to-serial converters each outputting a corresponding one of said digital samples.

21. The pulse shaping generator according to claim 12, wherein the respective digital waveform associated with at least one of the plurality of waveform data generators defines a gating digital signal having a binary structure and a pulse duration selected to gate a component of the pulsed laser oscillator.

22. The pulse shaping generator according to claim 21, further comprising:
- a pulse duration memory, in communication with the waveform data generator associated with the gating digital signal, for storing one or more pulse durations; and
- an address register for storing an address of a selected one of the pulse durations within said pulse duration memory and providing said address to the corresponding waveform data generator.

23. The pulse shaping generator according to claim 12, wherein the respective digital waveform associated with at least one of the plurality of waveform data generators defines a synchronizing digital signal set to be coincident with the optical output of the pulsed laser oscillator.

* * * * *